United States Patent [19]

Jamshidi

[11] Patent Number: 5,625,303
[45] Date of Patent: Apr. 29, 1997

[54] MULTIPLEXER HAVING A PLURALITY OF INTERNAL DATA PATHS THAT OPERATE AT DIFFERENT SPEEDS

[75] Inventor: Shahram Jamshidi, Santa Clara, Calif.

[73] Assignee: Intel Corporation, Santa Clara, Calif.

[21] Appl. No.: 534,485

[22] Filed: Sep. 27, 1995

[51] Int. Cl.[6] .................. H03K 19/084; H03K 19/094
[52] U.S. Cl. ................. 326/106; 326/108; 326/113; 327/408
[58] Field of Search ..................... 326/113, 105, 326/106, 108; 327/408, 410

[56] References Cited

U.S. PATENT DOCUMENTS

| | | | |
|---|---|---|---|
| 4,985,703 | 1/1991 | Kaneyama | 327/408 |
| 5,126,596 | 6/1992 | Millman | 326/113 |
| 5,162,666 | 11/1992 | Tran | 326/113 |

Primary Examiner—Edward P. Westin
Assistant Examiner—Richard Roseen
Attorney, Agent, or Firm—Blakely, Sokoloff, Taylor & Zafman

[57] ABSTRACT

A multiplexer. The multiplexer comprises a first data input and a second data input coupled to a logic gate via a first data path and a second data path, respectively, wherein a maximum of one of the first and second data paths is enabled to pass data at any given time. The data paths are independent of one another such that devices of the first data path do not load the second data path, and vice versa. The speed of a data path is determined by how many data input signals are routed through the same data path. In this manner, the speed of each data path may be tuned as required to provide the necessary operating speeds.

18 Claims, 9 Drawing Sheets

5,625,303

1

MULTIPLEXER HAVING A PLURALITY OF INTERNAL DATA PATHS THAT OPERATE AT DIFFERENT SPEEDS

FIELD OF THE INVENTION

The present invention relates generally to semiconductor devices and more particularly to a multiplexer having a plurality of internal data paths that operate at different speeds.

BACKGROUND

FIG. 1 is a block diagram of a traditional prior art N-to1 multiplexer ("MUX") 100 that comprises N data inputs 105, N select inputs 110, and a data output 115. At any given time, MUX 100 provides a single data path between one of the N data inputs 105 and data output 115 in response to asserting one of the N select inputs. Decoding logic 125 is typically provided to decode a select signal 130 and to assert the correct one of the N select inputs 110 in response the decoding of the select signal 130. Select signal 130 typically comprises a total of $\log_2 N$ conductors and is provided to simplify the interface between MUX 100 and the circuitry that determines which of the N data inputs 105 is to be coupled to data output 115.

FIG. 2 shows a static N-to1 multiplexer architecture according to the prior art. To simplify discussion, N is equal to two (2). Multiplexer 200 is shown as generally comprising N input buffers 210-211, N pass gates 220-221 controlled by N select inputs S0 and S1, and a single output buffer 235. Input buffers 210 and 211 are shown as inverters and are connected to receive data signals from data inputs D0 and D1, respectively. The output of input buffer 210 is coupled to a first terminal of pass gate 220, and the output of input buffer 211 is coupled to a first terminal of pass gate 221. The second terminals of pass gates 220 and 221 are both coupled to common node 230. Pass gates 220 and 221 act as switches for coupling the outputs of input buffers 210 and 211 to common node 230 in response to select inputs S0 and S1, respectively. Only one of the select inputs is asserted at any particular time. The input of output buffer 235, which is shown as an inverter, is coupled to the common node 230. Output buffer 235 outputs an output signal via data output 207 in response to the voltage at common node 230.

The voltage at common node 230 is determined by the output voltage of the selected input buffer and the RC time constant of common node 230. The output voltage of an input buffer swings between logic voltage levels (e.g. 0.0 volts and 3.3 volts) in response to the input signal at the input of the input buffer. The RC time constant of common node 230 is determined by the number of pass gates connected to common node 230, the load presented by each pass gate, and the parasitic capacitance of the conductor that comprises common node 230. As the number inputs N grows, the number of pass gates and the size of common node 230 increases, which increases the loading and the RC time constant of common node 230. As the RC time constant increases, the amount of time required for common node 230 to transition between logic states also increases, which slows the overall operation of multiplexer 200.

According to the multiplexer architecture of multiplexer 200, each pass gate is a complementary switch that comprises a p-channel transistor 240 having its source and drain coupled to the source and drain of an n-channel transistor 245. The select signal of each pass gate is connected directly to the gate of the n-channel transistor 245 and coupled via an inverter 250 to the gate of p-channel transistor 240. The

2 advantage of complementary switch pass gates is that the voltage at common node 230 can swing between the full logic values output by the connected input buffer. One disadvantage of complementary switch pass gates is increased loading of common node 230.

FIG. 3 shows an alternative static multiplexer architecture of the prior art wherein =each pass gate comprises a single n-channel transistor. Multiplexer 300 is shown as generally comprising N input buffers 310–311, N pass gates 320–321 controlled by N select inputs S0 and S1, and a single output buffer 335, wherein N is again equal to two. Using a single transistor as a pass gate results in reduced loading of common node 330 when compared to the complementary pass gate architecture of FIG. 2. Furthermore, single transistor pass gates requires less semiconductor die area to implement when compared to complementary transistor pass gates. Unfortunately, using n-channel transistors as pass gates limits the maximum voltage of common node 330 to a voltage of (VCC–$V_{tn}$), wherein VCC is the operating voltage $V_{tn}$ is the threshold voltage of the n-channel transistor that comprises a pass gate. As the value of the operating voltage VCC for integrated circuits continues to decrease, a voltage drop of $V_{tn}$ becomes increasingly significant.

For occasions wherein the number of signals N must be large and high speed operation is desired, using a single prior art N-to-1 multiplexer is impractical because of the large RC time constant of the common node and the correspondingly slowed operation of the multiplexer. FIG. 4 shows an arrangement wherein two or more smaller multiplexers may be linked to functionally operate as a single N-to-1 multiplexer. Breaking a single N-to-1 multiplexer into several smaller multiplexers reduces the loading at each of the common nodes of the smaller multiplexers, which increases the speed of operation for each smaller multiplexer when compared to the single N-to-1 multiplexer.

FIG. 4 shows a multiplexing arrangement comprising two m-to-1 multiplexers 406 and 407, wherein m is equal to N/2, each having its output coupled to an input of a two-to-1 multiplexer 408. Multiplexer 408 is provided because the voltage at the common node of a multiplexer is ultimately determined by the data signal that is selected to be passed by the multiplexer. For multiplexing arrangement 400, only one of the multiplexers 406 and 407 is selected at any one time, and the common node of the unselected multiplexer is left to float at whatever voltage it was previously charged to. Therefore, a logic gate such as an OR gate or a NOR gate may not be used to combine the outputs of multiplexers 406 and 407 because the output of the unselected multiplexer cannot be predicted.

There are several disadvantages associated with multiplexing arrangement 400. First, decoding logic 415 is more complex than the decoding logic of a single N-to-1 multiplexer and requires more semiconductor die area to implement. Furthermore, having multiple multiplexers greatly complicates the layout of multiplexing arrangement 400. For example, it is desirable to maintain the shortest signal path possible between data inputs 405 and data output 410, but the select inputs of the multiplexers must be routed to the pass gates. It is difficult to provide a compact layout having the shortest possible signal path, and implementing multiplexing arrangement 400 therefore presents an imposing task when semiconductor die area is limited.

SUMMARY AND OBJECTS OF THE INVENTION

Therefore, it is an object of the present invention to provide an improved multiplexer architecture.

This and other objects of the invention are provided by a multiplexer that comprises a first data input and a second data input coupled to a logic gate via a first data path and a second data path, respectively, wherein a maximum of one of the first and second data paths is enabled to pass data at any given time. The data paths are independent of one another such that devices of the first data path do not load the second data path, and vice versa. The speed of a data path is determined by how many data input signals are routed through the same data path. In this manner, the speed of each data path may be tuned as required to provide the necessary operating speeds.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A dynamic multiplexer architecture is described wherein a clocked biasing circuit is coupled to the common node of the multiplexer for pre-biasing the common node to a known voltage in response to a clock signal when data is not to be passed by the multiplexer. According to one embodiment, the clocked biasing circuit acts as a pull-up device for precharging the common node to the operating voltage VCC when the clock signal is in a bias state. The clocked biasing circuit is switched off and data may be passed by the multiplexer when the clock signal is in a drive state. The clocked biasing circuit allows the pass gates to be implemented using a single type of transistor. Furthermore, the dynamic multiplexer architecture allows for simplified multiple multiplexer arrangements requiring reduced semiconductor die area when compared to prior art arrangements. The dynamic multiplexer architecture also allows the designer to define multiple internal data paths having different loading and operating speeds so that critical data inputs may be more quickly transferred by a multiplexer.

Figure 1:
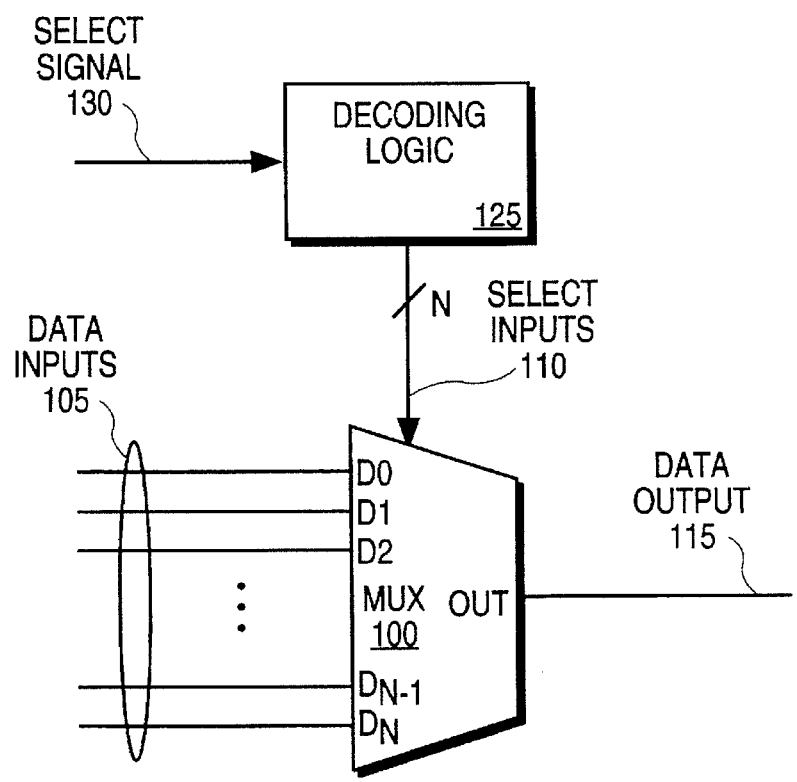
FIG. 1 shows a prior art static multiplexer in block diagram form.
Figure 2:
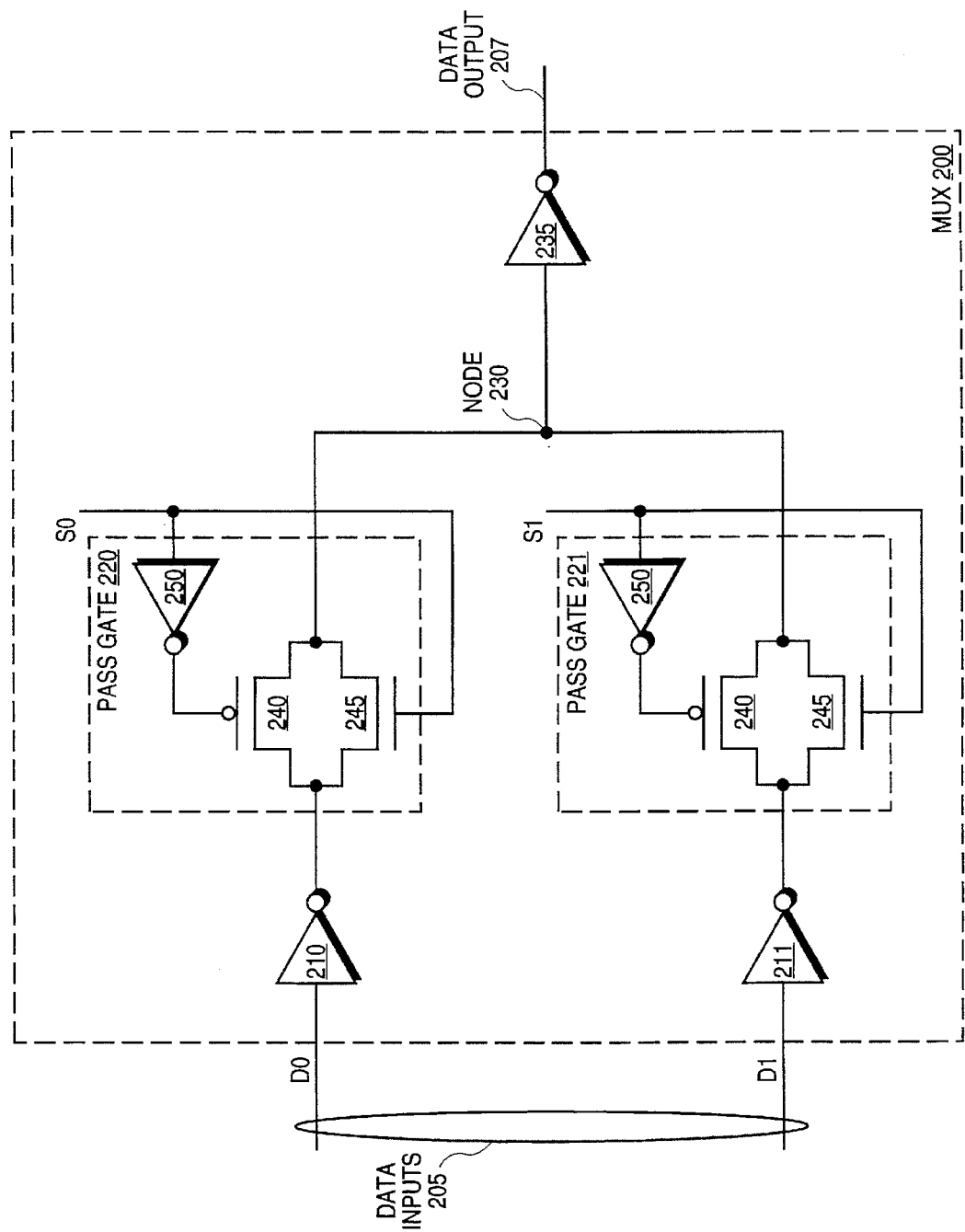
FIG. 2 shows one prior art multiplexer architecture.
Figure 3:
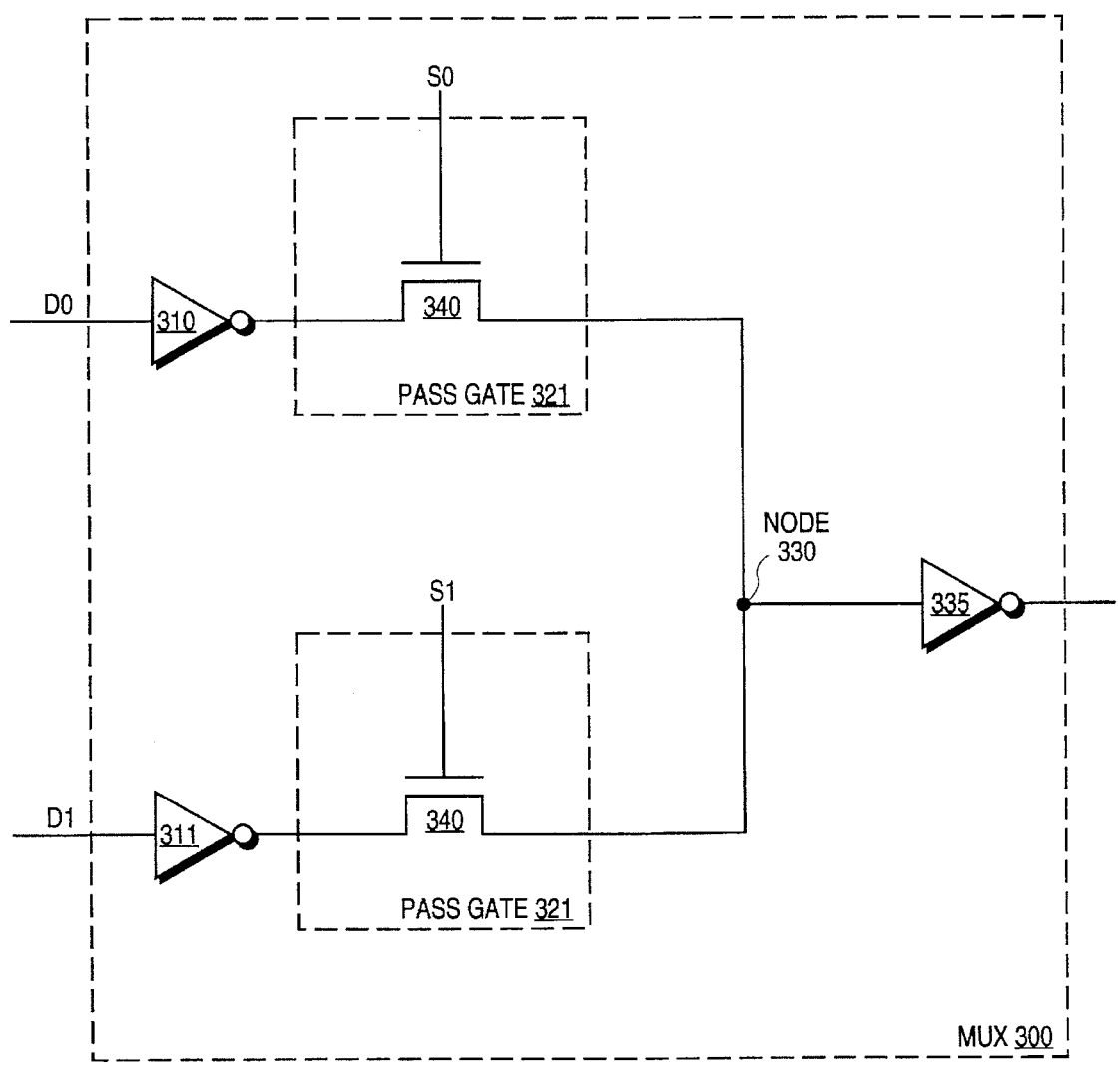
FIG. 3 shows an alternative prior art multiplexer architecture.
Figure 4:
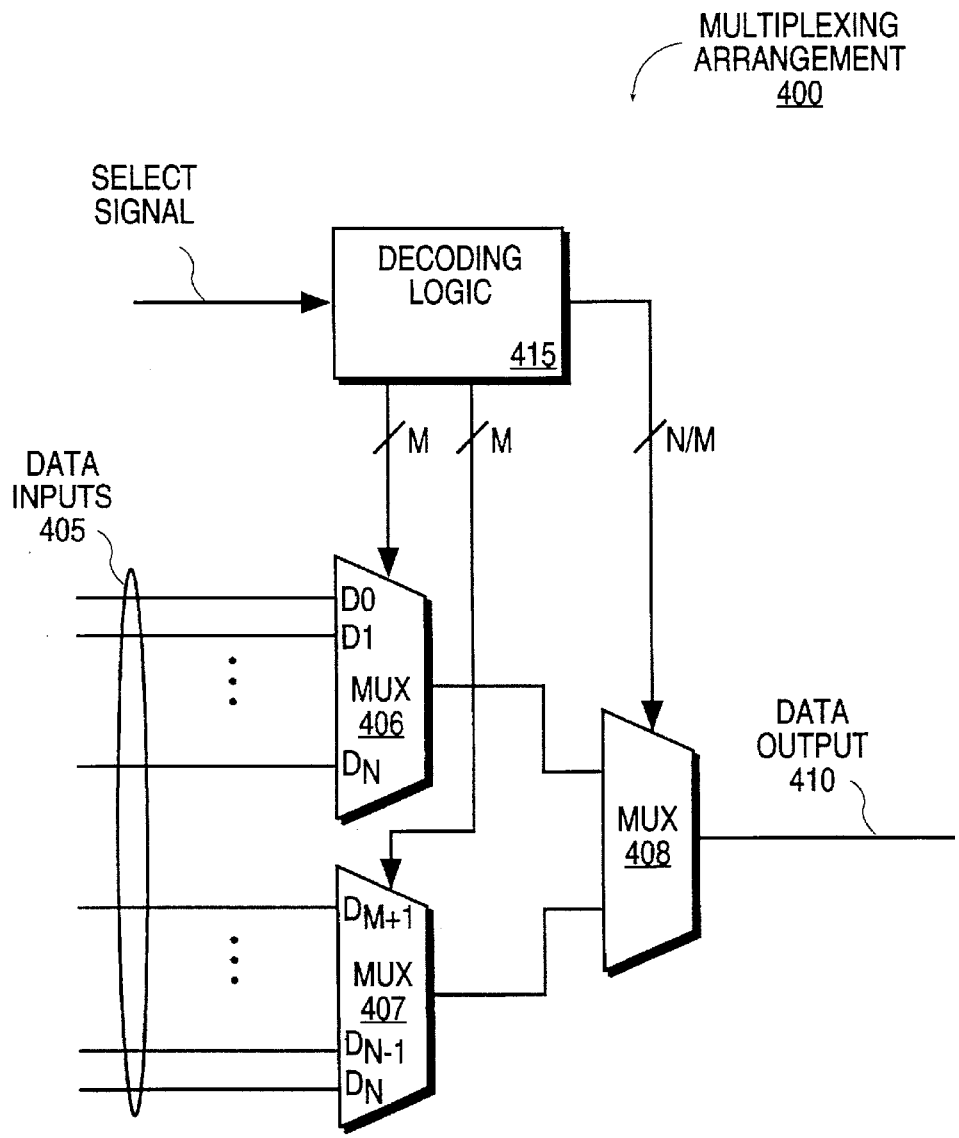
FIG. 4 shows a prior art multiplexing arrangement.
Figure 5:
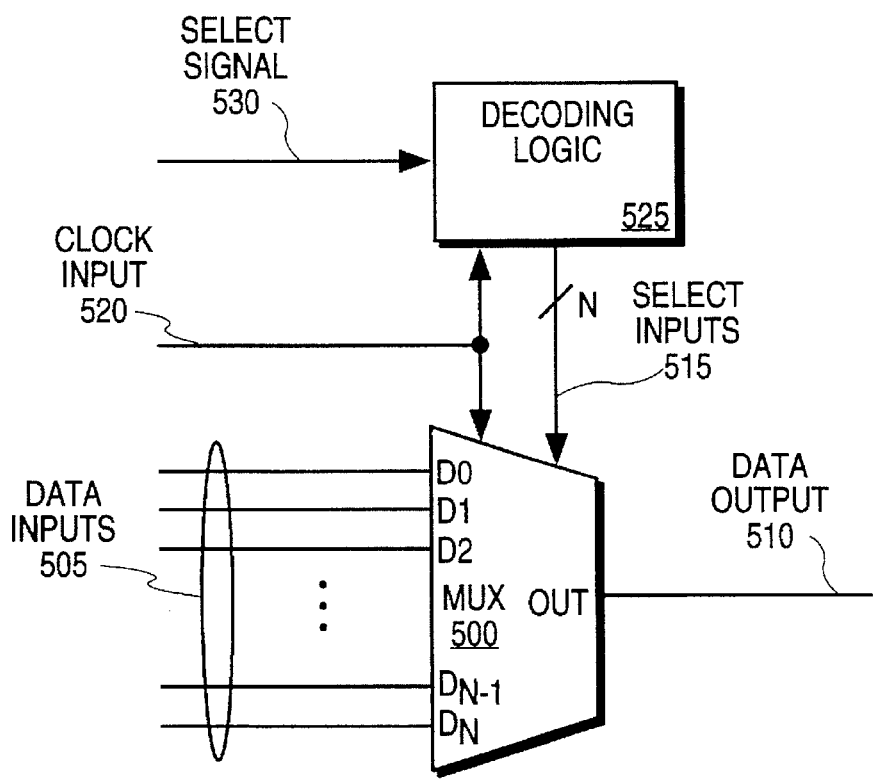
FIG. 5 shows a dynamic multiplexer according to one embodiment.

FIG. 5 shows a multiplexer and associated circuitry that operate according to one embodiment. Multiplexer 500 includes N data inputs 505, a single data output 510, N select inputs 515, and is coupled to a clock input 520 that carries a clock signal CLK. As shown, decoding logic 525 controls assertion of the appropriate select input in response to the select signal 530 and the CLK signal. Accordingly, decoding logic 525 is shown as being coupled to clock input 520.

When multiplexer 500 and decoding logic 525 are provided using complementary metal oxide semiconductor (CMOS) technology, the CLK signal is a square wave signal. Multiplexer 500 drives data when the CLK signal is in a "drive" state wherein a clocked biasing circuit (shown in FIG. 6) of multiplexer 500 is switched off and decoding logic 525 is enabled to assert a corresponding one of the select inputs 515. The drive state is equivalent to the "evaluation" state of domino logic devices, and multiplexer 500 is well-suited for use with domino logic devices. Multiplexer 500 does not drive data when the CLK signal is in a "bias" state wherein the clocked biasing circuit of multiplexer 500 is switched on to bias the common node of multiplexer 500 to a known voltage. According to one embodiment, the drive state corresponds to the CLK signal being in a logic high state, and the bias state corresponds to the CLK signal being in a logic low state.

Devices connected to data output 510 of multiplexer 500 do not sample the data output 510 when the CLK signal is in the "bias" state. Alternatively, a latch may be provided at the output of multiplexer 500 wherein the latch transparently passes data during the drive state and latches the last driven data during the bias state.

Figure 6:
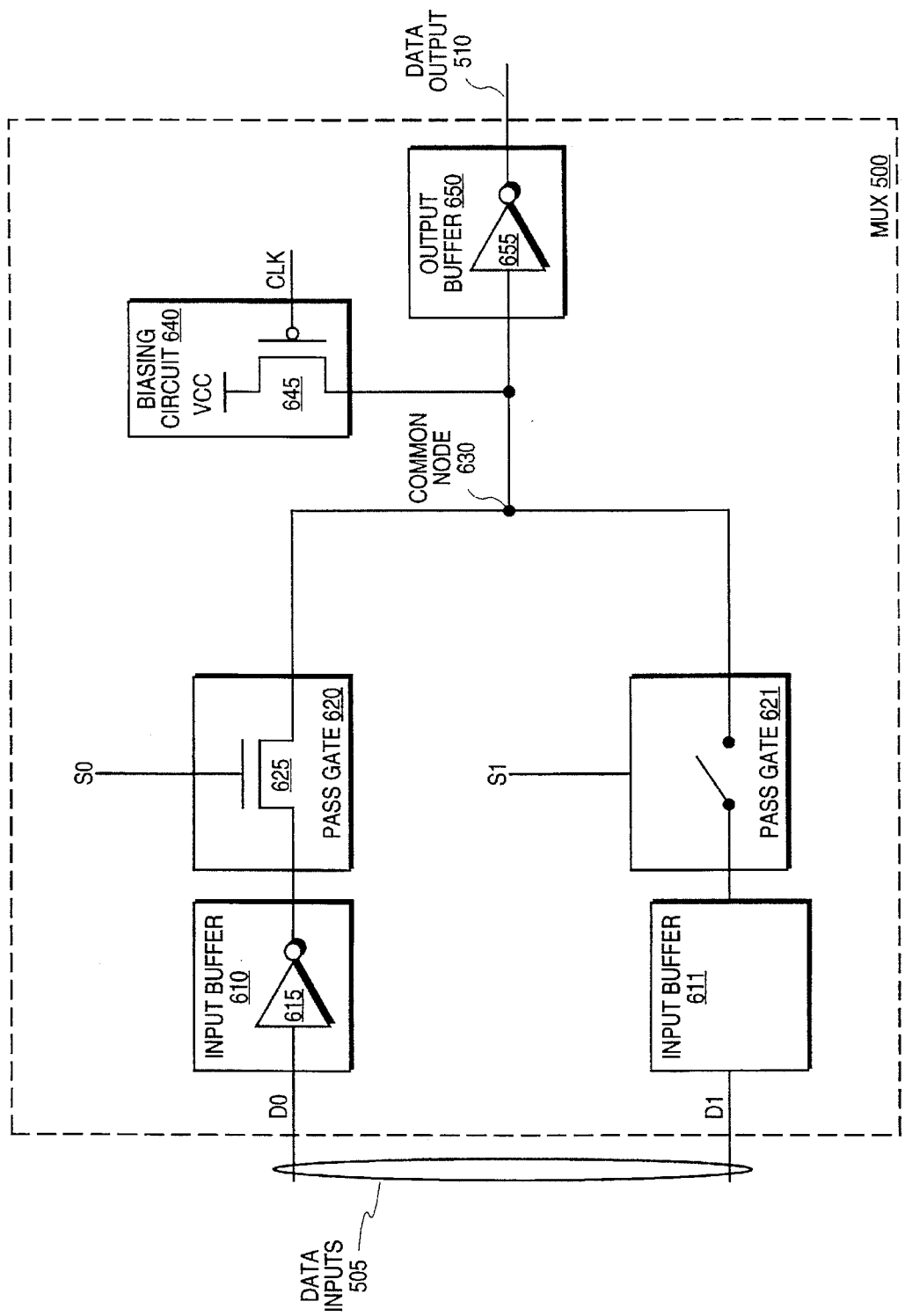
FIG. 6 shows a dynamic multiplexer of one embodiment in more detail.

FIG. 6 shows an embodiment of N-to1 multiplexer wherein the number of data inputs N is equal to two (2). Multiplexer 500 generally comprises N input buffers and N pass gates, one for each of N data inputs 505. As shown, data input D0 is coupled to the input of input buffer 610, which is shown as an inverter 615 having its output coupled to one terminal of pass gate 520. Input buffer 610 may comprise any alternative input buffering arrangement. Pass gate 620 is shown as an n-channel transistor 625 but may alternatively comprise a p-channel transistor data input D1 is coupled to the input of data buffer 611, which has its output coupled to a terminal of pass gate 621. Pass gate 621 is shown as a switch to emphasize the function performed by the pass gates of multiplexer 500. Generally, input buffer 611 and pass gate 621 will comprise components that are substantially identical to the components of input buffer 610 and pass gate 620.

Pass gates 620 and 621 are controlled by select inputs S0 and S1, respectively, to couple the outputs of input buffers 610 and 611 to common node 630. The decoding circuitry 525 of FIG. 5 is enabled to assert only one of the N select inputs S0 and S1 when the CLK signal is in the drive state. The decoding circuitry 525 of FIG. 5 is disabled from asserting a select input when the CLK signal is in the bias state. Output buffer 650, which is shown as an inverter 655, has its input coupled to common node 630 and outputs a data signal via data output 510 in response to the voltage of common node 630. The data signal output by output buffer 650 via data output 510 is only sampled by connected devices when multiplexer 500 is operating in the drive state.

Biasing circuit 640 is provided to bias common node 630 to a known voltage when the CLK signal is in the bias state. According to the embodiment of FIG. 6, biasing circuit 640 comprises a p-channel transistor 645 having its source coupled to the operating supply voltage VCC, its drain coupled to common node 630, and its gate coupled to the CLK signal. Biasing circuit 640 thus biases or "precharges" common node 630 to the operating supply voltage VCC when the CLK signal is in a logic low state. Biasing circuit 640 may alternatively comprise an n-channel transistor coupled to system ground VSS for discharging common node 630 to VSS when multiplexer 500 is operating in the bias state. If biasing circuit 640 comprises a discharging n-channel transistor, each pass gate of multiplexer 500 preferably comprises a p-channel transistor, and the bias state of the CLK signal is the logic high state.

The dynamic multiplexer architecture shown in FIGS. 5 and 6 provides a number of advantages over prior static multiplexer architectures. First, the use of biasing circuitry allows the common node to swing between the operating supply voltage VCC and system ground VSS when a pass gate comprising a single MOS transistor is used. Thus, the performance of complementary transistor pass gates is achieved within the reduced area required by single transistor pass gates. Furthermore, as will be discussed in more detail below, the use of biasing circuitry enables the use of a logic gate as the output buffer of the multiplexer for combining one or more separately defined data paths that each comprise an independent node to which a set of one or more pass gates are coupled. This aspect of the dynamic multiplexer architecture similarly provides for relatively simple multiple dynamic multiplexer arrangements wherein logic gates are used to combine the outputs of the multiple dynamic multiplexers. Thus, the decoding logic of the multiplexer arrangement may be made simpler than that of prior static multiplexer arrangements.

Figure 7:
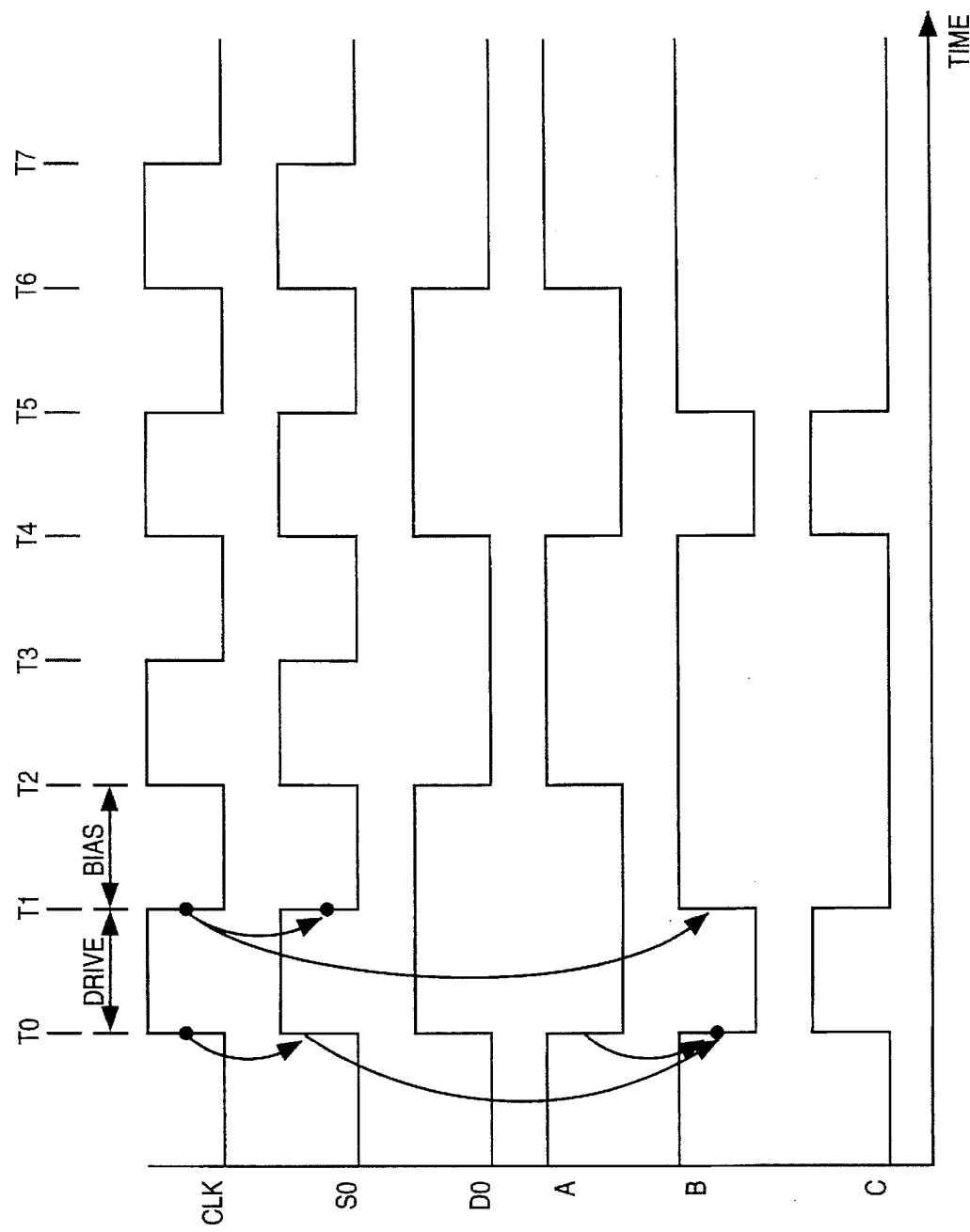
FIG. 7 illustrates operation of the dynamic multiplexer of FIG. 6 with a timing diagram.

FIG. 7 is a timing diagram illustrating the operation of multiplexer 500. The timing diagram shows the CLK signal, the S0 signal at select input S0, the D0 signal at data input D0, a signal "A" indicative of the voltage at the output of input buffer 610, a signal "B" indicative of the voltage at common node 630, and a signal "C" indicative of the output signal of output buffer 650. FIG. 7 shows an example wherein S0 is alternately asserted and deasserted in response to the CLK signal such that the voltage at common node 630 is determined by data signal D0 when multiplexer 500 is operating in the drive state and such that the voltage at the common node is precharged to the operating voltage VCC when multiplexer 500 is operating in the bias state. Wherein the CLK and S0 waveforms imply a fifty percent duty cycle, the drive state of the multiplexer may be extended, and a fifty percent duty cycle is not required.

According to the present embodiment, multiplexer 500 operates in the drive state when the CLK signal is logic high and in the bias state when the CLK signal is in the logic low state. The present embodiment assumes that the CLK signal and the "data clock" at which data is driven are operating in-phase and at the same clock frequency, but the CLK signal may operate at higher clock frequencies than the data clock, e.g. twice the clock frequency of the data clock. Wherein signal S0 is an active high signal, the S0 and CLK signals are substantially in phase.

Prior to time T0, the CLK, S0, D0, and C signals are logic low, and the A and B signals are logic high. The A signal is logic high in response to the D0 signal being logic low, and the B signal is logic high in response to biasing circuitry 640 being switched on. At time T0, multiplexer 500 enters the drive state when the CLK signal transitions to the logic high state. Signal S0 goes high in response to the CLK signal going high, which causes pass gate 610 to switch on, passing signal A to common node 630. Because the D0 signal transitions to the logic high state at time T0, the A signal transitions to the logic low state, and the B signal is similarly pulled low. Signal C goes high in response to the voltage at the common node being low.

At time T1, multiplexer 500 enters the bias state when the CLK signal transitions to the logic low state, which causes the S0 signal to go low, switching off pass gate 610. Biasing circuitry 640 is switched on in response to the CLK signal being in the bias state such that common node 630 is pulled high, as shown by the waveform for signal B. Output buffer 650 inverts the voltage at common node 630 to produce a logic high signal at data output 510, as shown by the waveform for signal C. Devices coupled to data output 510 do not sample the output signal when multiplexer operates in the bias state.

At time T2, multiplexer 500 again enters the drive state when the CLK signal transitions to the logic high state. Because the data input signal D0 transitions to a logic low, input buffer 610 outputs a logic high as shown by the waveform for signal A. Because the voltage at the source and drain of n-channel transistor 615 is equal, n-channel transistor conducts no current in response to its gate receiving the high S0 signal. Thus, the voltage at common node 620 remains at VCC, which causes the output signal at the data output 510 to remain at logic low value. Operation of multiplexer 500 continues in a similar manner, as shown by FIG. 7.

Figure 8:
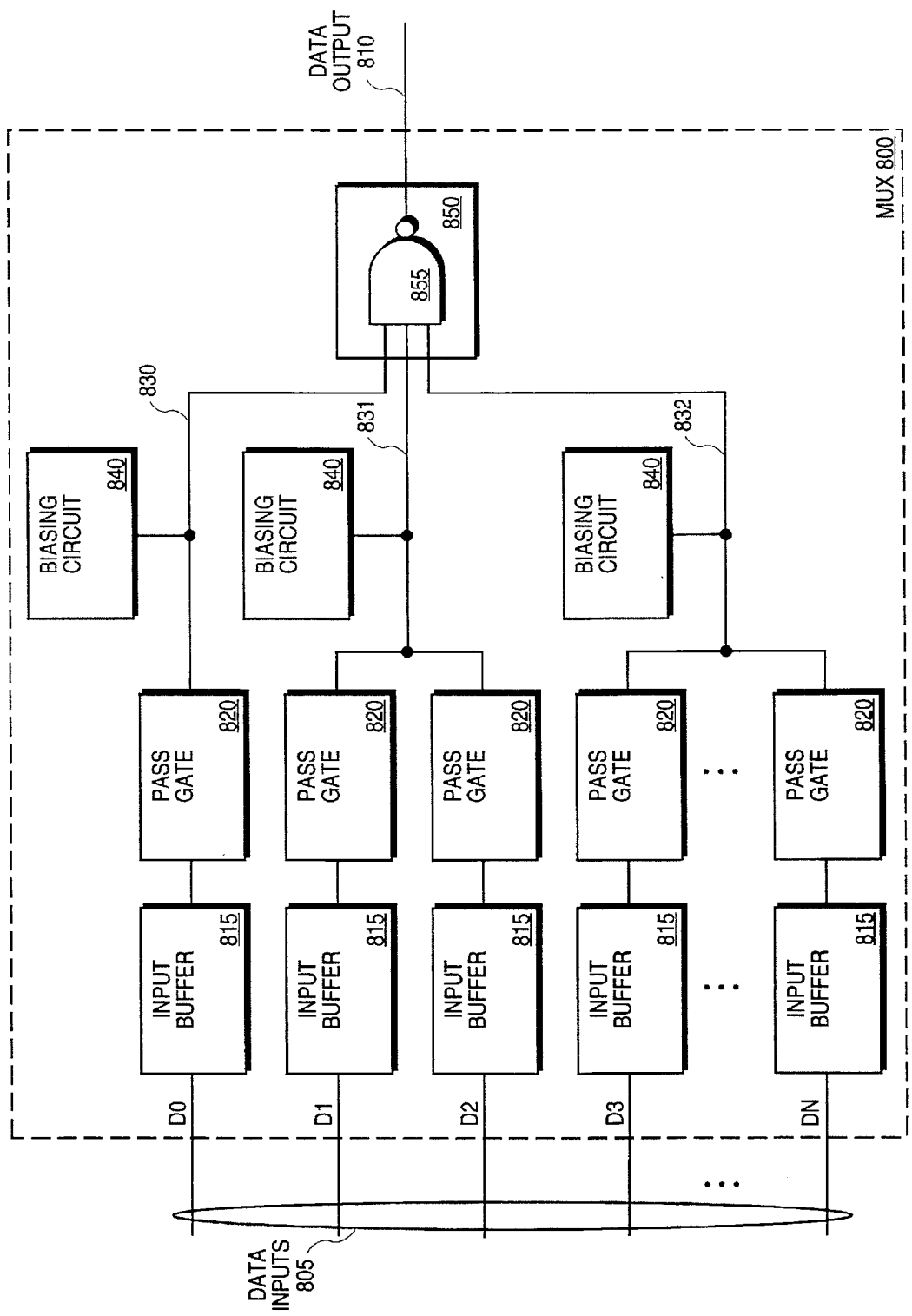
FIG. 8 shows a dynamic multiplexer of an alternative embodiment.

FIG. 8 shows an alternative arrangement of multiplexer 500 wherein multiple sets of one or more data inputs are individually provided with their own "data path" comprising a common node and a biasing circuit to reduce the loading at each common node. For example, data input D0 comprises a first set of data inputs that is coupled via an input buffer 815 and pass gate 820 to its own node 830, which is biased by a biasing circuit 840 when multiplexer 800 is operating in the bias state. Data inputs D1 and D2 form a second set of data inputs, and each data input D1 and D2 is coupled to a common node 831 via a corresponding input buffer 815 and pass gate 820. Common node 831 is biased by a second biasing circuit 840. A third set of data inputs is formed by data inputs D3-DN, wherein each of the third set of data inputs is coupled to a common node 832 via corresponding input buffer and pass gate. The input buffers, pass gates, and biasing circuits are equivalent to those discussed previously.

Each of the common nodes 830–832 are provided as inputs to output buffer 850, which operates as a logic gate. According to a present embodiment wherein the input buffers 815 comprise inverters, output buffer 850 comprises a NAND gate 855. Alternatively, output buffer 850 may comprise any appropriate logic circuit. The speed of each data path may be tuned by adjusting the number of data inputs that share the data path, which adjusts the number of pass gates coupled to the common node of the data path.

Figure 9:
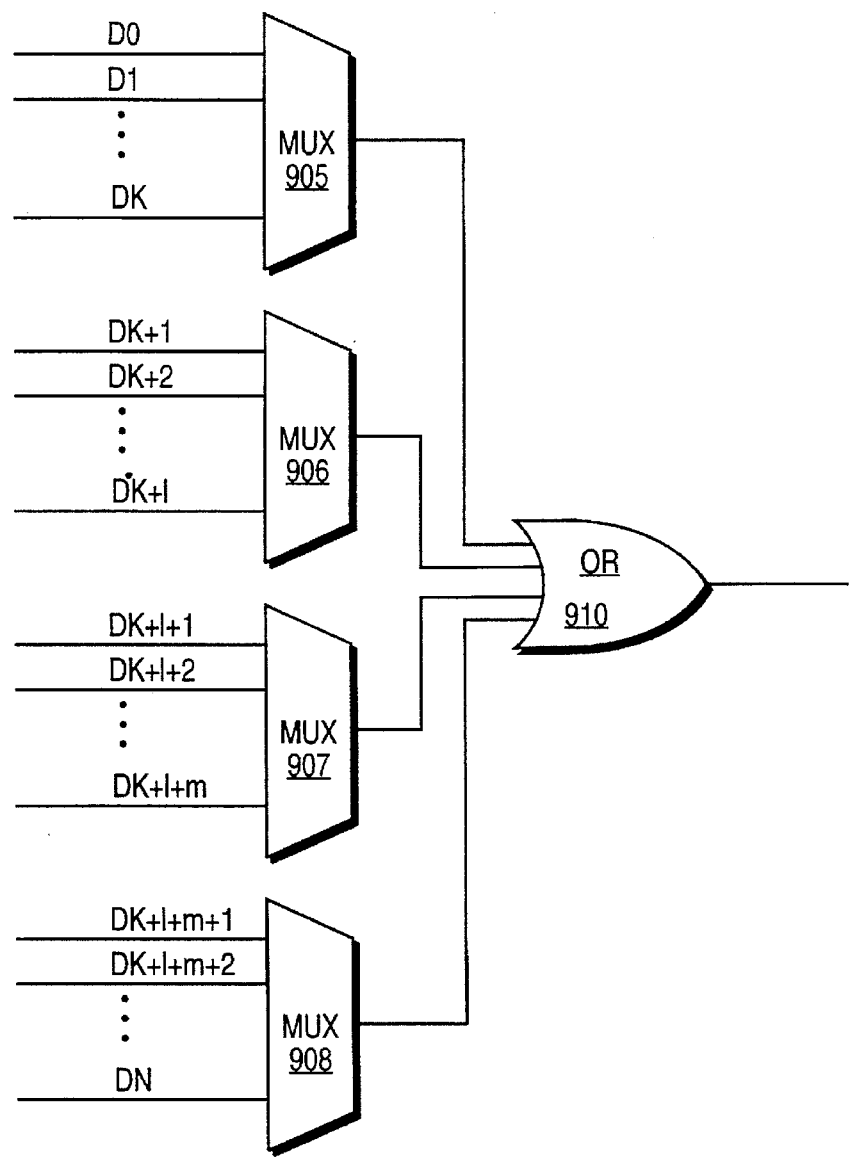
FIG. 9 shows a multiplexing arrangement using dynamic multiplexers such as those shown in FIGS. 6 and 8.

FIG. 9 shows a multiplexing arrangement 900 according to one embodiment wherein several dynamic clocked multiplexers 905–908 have their outputs coupled to logic circuit 910. According to the present embodiment, logic circuit 910 comprises a logical OR gate, but according to alternative embodiments logic circuit 910 may provide any suitable logic function as required by the particular topology of the dynamic clocked multiplexers 905–908. Multiplexer 905 is shown as having k inputs, multiplexer 906 is shown as having l inputs, multiplexer 907 is shown as having m inputs, and multiplexer 908 has n inputs, wherein k+l+m+n is equal to N.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A multiplexer comprising:

a first data input;

a second data input;

a logic gate having a first input and a second input coupled to provide a data output;

a first input buffer and a first pass gate coupled in series between the first data input and the first input of the logic gate;

a first biasing circuit coupled to the first input of the logic gate, the first biasing circuit being operative to bias the first input of the logic gate to a known voltage when the first pass gate is switched off;

a second data path coupled between the second data input and the second input of the logic gate, a maximum of one of the first pass gate and the second data path being enabled to pass data at any given time.

2. The multiplexer of claim 1, wherein the second data path comprises:

a second input buffer and a second pass gate coupled in series between the second data input and the second input of the logic gate;

a second biasing circuit coupled to the second input of the logic gate, the biasing circuit being operative to bias the common node to the known voltage when the second pass gate is switched off.

3. The multiplexer of claim 1, further comprising a third data input wherein the second data path comprises:

a second input buffer and a second pass gate coupled in series between the second data input and the second input of the logic gate;

a third input buffer and a third pass gate coupled in series between the third data input and the second input of the logic gate; and a second biasing circuit coupled to the second input of the logic gate, the biasing circuit being operative to bias the common node to the known voltage when the second and third pass gates are switched off.

4. The multiplexer of claim 2 wherein the first and second input buffers each comprise an inverter.

5. The multiplexer of claim 4 wherein the first and second pass gates each comprise an n-channel transistor.

6. The multiplexer of claim 2 wherein the first and second biasing circuits each comprise a p-channel transistor having a drain coupled to a corresponding input of the logic gate, a source coupled to the supply voltage, and a gate coupled to a control signal, the p-channel transistors of the first and second biasing circuits being switched on to bias the common node to the supply voltage when the control signal is asserted.

7. The multiplexer of claim 6 wherein the control signal is a clock signal, the p-channel transistors of the first and second biasing circuits being switched on when the clock signal is in a bias state and switched off when the clock signal is in a drive state.

8. The multiplexer of claim 1 wherein the logic gate performs a logical NAND function.

9. A multiplexer comprising:

a first data path comprising:

a first input buffer and a first pass gate coupled in series between a first data input and a first common node; and a first biasing circuit coupled to the first common node and a supply voltage, the biasing circuit being operative to bias the first common node to the supply voltage when the first pass gate is switched off;

a second data path comprising:

a second input buffer and a second pass gate coupled in series between a second data input and a second common node;

a second biasing circuit coupled to the second common node and a supply voltage, the biasing circuit being operative to bias the second common node to the supply voltage when the second pass gate is switched off; and an output buffer coupled to the first and second common nodes, the output buffer operative to output an output signal to a data output in response to voltages at the first and second common nodes.

10. The multiplexer of claim 9 wherein the first and second input buffers each comprise an inverter.

11. The multiplexer of claim 10 wherein the first and second pass gates each comprise an n-channel transistor.

12. The multiplexer of claim 9 wherein the first and second biasing circuits each comprise a p-channel transistor having a drain coupled to respective common nodes, a source coupled to the supply voltage, and a gate coupled to a control signal, the p-channel transistors of the first and second biasing circuits being switched on to bias the respective common nodes to the supply voltage when the control signal is asserted.

13. The multiplexer of claim 12 wherein the control signal is a clock signal, the p-channel transistors of the first and second biasing circuits being switched on when the clock signal is in a bias state and switched off when the clock signal is in a drive state.

14. The multiplexer of claim 13 wherein the first and second pass gates are switched off when the clock signal is in the bias state and wherein only one of the first and second pass gates is switched on when the clock signal is in the drive state.

15. The multiplexer of claim 13 wherein the bias state corresponds to a logic low state, and the drive state corresponds to a logic high state.

16. The multiplexer of claim 9 wherein the output buffer comprises a logical NAND gate.

17. The multiplexer of claim 9 wherein the multiplexer operates in a drive state wherein data is passed from a selected one of the first and second data inputs to the data output, and wherein the multiplexer operates in a bias state wherein the biasing circuit biases the common node to the supply voltage.

18. The multiplexer of claim 9 wherein the first data path further comprises a third input buffer and a third pass gate coupled in series between a third data input and the first common node.

* * * * *

UNITED STATES PATENT AND TRADEMARK OFFICE
CERTIFICATE OF CORRECTION

PATENT NO. : 5,625,303
DATED : April 29, 1997
INVENTOR(S) : Shahram Jamshidi

It is certified that error appears in the above-identified patent and that said Letters Patent is hereby corrected as shown below:

In column 4 at line 36 delete "transistor data" and insert --transistor. Data--

Signed and Sealed this

Twenty-fifth Day of November, 1997

Attest:

BRUCE LEHMAN

*Attesting Officer*

*Commissioner of Patents and Trademarks*